United States Patent [19]

Chason et al.

[11] Patent Number: 5,083,236
[45] Date of Patent: Jan. 21, 1992

[54] INDUCTOR STRUCTURE WITH INTEGRAL COMPONENTS

[75] Inventors: Marc K. Chason, Schaumburg; Robert A. Kellen, Arlington Heights, both of Ill.; Leng H. Ooi, Sunrise; George Revtai, Plantation, both of Fla.

[73] Assignee: Motorola, Inc., Schaumburg, Ill.

[21] Appl. No.: 589,954

[22] Filed: Sep. 28, 1990

[51] Int. Cl.$^5$ ............................................. H05K 1/18
[52] U.S. Cl. .................................. 361/401; 361/397; 333/204
[58] Field of Search ............. 333/238, 246; 336/84 C, 336/84 R, 200, 232, 186; 361/401, 407, 412, 414; 174/32, 36

[56] References Cited

U.S. PATENT DOCUMENTS

| | | | |
|---|---|---|---|
| 3,534,301 | 10/1970 | Golembeski | 333/204 |
| 3,835,421 | 9/1974 | De Brecht et al. | 333/26 |
| 3,976,959 | 8/1976 | Gaspari | 333/26 |
| 4,266,206 | 5/1981 | Bedard et al. | 333/204 |
| 4,288,761 | 9/1981 | Hopfer | 333/238 |
| 4,418,324 | 11/1983 | Higgins | 333/204 |
| 4,739,289 | 4/1988 | Cripps | 333/26 |
| 4,959,631 | 9/1990 | Hasegawa et al. | 336/232 |
| 4,999,597 | 3/1991 | Gaynor | 336/232 |
| 5,025,232 | 6/1991 | Pavio | 333/238 |

Primary Examiner—Leo P. Picard
Assistant Examiner—Donald A. Sparks
Attorney, Agent, or Firm—Joseph P. Krause

[57] ABSTRACT

An inductor structure, that houses a shorted transmission line inductor, includes components mounted within the volume carrying the shorted transmission line. Dielectric substrate layers which carry the shorted transmission line components and the electronic devices when sandwiched together can be coated with a metallic layer that acts as a shield protecting the internal components from external undesired sources. Mounting components within the inductor volume potentially saves space on a circuit board.

59 Claims, 1 Drawing Sheet

INDUCTOR STRUCTURE WITH INTEGRAL COMPONENTS

BACKGROUND OF THE INVENTION

This invention relates to inductors. In particular, this invention relates to high frequency inductors, particularly those suitable for use as surface mount components.

Inductors are of course well known in the electronic art and it is will known that any length of conducting material will have some inductance associated with it. In many radio devices, particularly radios operating in the high frequency ranges, above 800MHz for example, useful small inductance value inductors are fabricated by short circuiting small lengths of transmission line at one end. (The open-circuit end of the transmission line has an inductance associated with it.) Some of these short circuited transmission line inductors are fabricated by plating strips of conductive material onto dielectric materials. The plated materials form a transmission line center conductor and an outer conductor with the center and outer conductors shorted together.

Many high-frequency inductors use a polymeric material having low dielecric constants and high dielectric losses. (Some of the prior art polymeric materials have dielectric constants between two and four in the frequency range between 800 and 900 MHz and have a dielectric loss approaching 0.0013.) While this material has certain desirable electrical characteristics, it is difficult to re-design inductors using this material because of its own fabrication requirements.

A ceramic material or glass material that has low dielectric loss and low dielectric constant that are more easily fabricated might be an improvement over the prior art. Because these other materials are relatively easy to work with, they may be formed into shapes and sizes that permit space savings in compact radio circuits.

SUMMARY OF THE INVENTION

There is disclosed herein a shorted transmission line inductor formed by depositing conductive paths, onto dielectric substrates that when assembled together form a solid volume. The conductive paths generally resemble a cross-section of a coaxial cable, i.e., a center conductive path bordered on either side by substantilly parallel paths, corresponding to a coax cable's outer conductor.

This solid volume that encloses the shorted transmission line inductor can be coated with conductive material, which if electrically connected to the shorted end of the transmission line and electrical ground, acts as a shield, isolating the interior of the coated solid volume from elecrical signal on the exterior of the device.

Having electrically shielded the interior of the solid volume that contains the inductor from extraneous electrical signals, the shielded volume can be used to house electrical components, such as resistors, capacitors and transistor, that might benefit from electrical shielding provided by the exterior layer. Components, such as resistors, capacitors, or even perhaps integrated circuits can be mounted into recessed in the dielectric layers or in the space between the dielectric layers.

Figure 4:
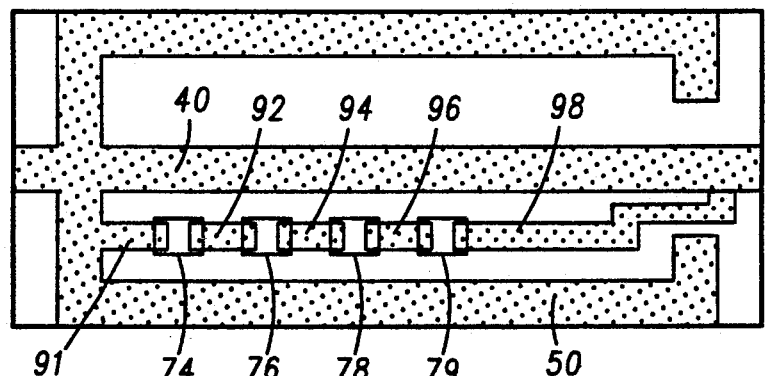
FIG. 4 shows a alternate top view of the structure shown in FIG. 1.

IFG. 5 shows a side view of the structure shown in FIG. 4.

DESCRIPTION OF A PREFERRED EMBODIMENT

Figure 1:
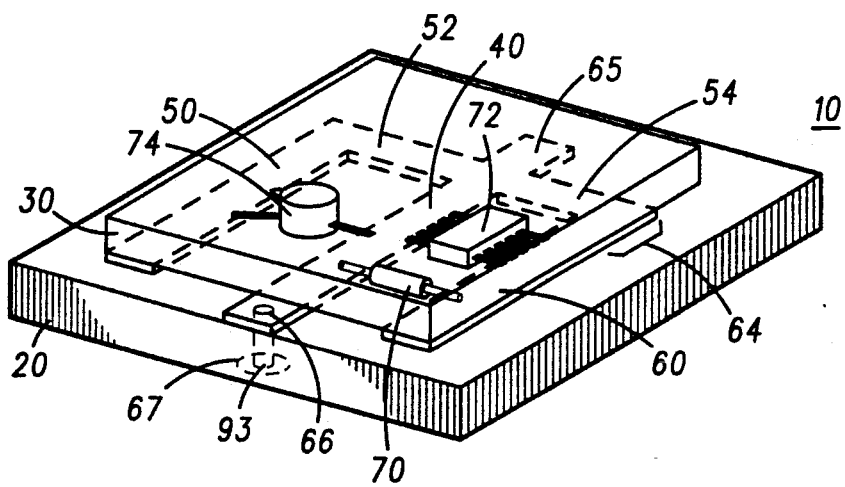
FIG. 1 shows an isometric view of an inductor structure including internally mounted components.

FIG. 1 shows an isometric view of an inductor structure (10) that includes a shorted transmission line inductor and internally mounted elecrical components. The structure (10) is comprised of at least two dielectric layers (20 and 30), at least one of which has one or more conductive strips deposited onto it such that when the two layers are coupled together, or brought into close proximity with each other, the conductive strips are electrically connected at one end and are spatially positioned to resemble a cross-section of a coaxial cable (i.e. there is a center conductor (40) and two, substantially parallel strips (50 and 60) on either side of the center conductor (40) that correspond to the outer conductor or shield of a coaxial cable. The spatial relationship of the center conductor strip (40) to the outer house conductor strips (50 and 60), together with their connecation at one end (64) produce the desired shorted transmission line effect. From the open circuit end (i.e. non-short circuit end) the conductive strips have a desired inductance at some particular frequency.

In the preferred embodiment, the conductive strips (40, 50 and 60) and the portions connecting these together (52 and 54) were all deposited onto the lower dielectric substrate (20). One or more of the conductive strips however, might be deposited on either substrate, e.g., the center strip (40) might be deposited onto the eupper dielectric substrate (30) while the outer strips (40 and 60) as well as portions of the section joining the center and outer strips together (52 and 54) might be on the lower dielectric layer (20).

When the upper and lower dielectric layers (30 and 20) are joined together, they virtually enclose the conductive strips (40, 50 and 60). (The conductive material comprising the conductive strips will have a finite thickness, which when lying on top of the dielectric layers' surface, might prevent the upper and lower dielectric layers, which are substantially planar sheets, from actually contacting each other.) Depending upon the thickness of the conductive strips, (40, 50, 52, 54 and 60) electrical components can be mounted either between the dielectric layers (20 and 30) or within recesses or recessed volumes in the dielectric layers when the layers are brought together.

Since the combination of the upper and lower dielectric layers (20 and 30), which in the preferred embodiment are solid materials, forms a solid volume, a conductive layer can be deposited over the exerior surface of the solid volume that can provide an electrical shield to the interior volume of the solid. A conductive layer, not shown in FIG. 1, is preferably deposited over the exterior of the solid volume formed by the first and second dielectric layers (20 and 30) enclosing the conductive strips (40, 50, 52, 54, and 60). This outer conductive layer preferably contacts one end of the shorted transmission line (64) via a conductive portion (65) of the conductive strips that extends beyond the outward limit if the upper dielectric layer (30). Coupling the outer conductive layer to the short-circuited end (64) of the shorted transmission line (which is porvided by conductors 40, 50 and 60 short circuited by conductive segments 52 and 54) electrically couples the short circuit end of the transmission line to the conductive outer layer. Grounding these two completes an electrical circuit which provides an electric shield for signals within the solid volume formed by the dielectric layers.

Electrical signals are injected into the transmission line through a connection node (66), which in the embodiment shown in FIG. 1 is on the upper surface of the lower dielectric layer (20) it should be obvious that to couple signals into the interior of the inducator structure (10) that a conductive outer layer coupled to and surrounding the solid volume formed by the upper and lower dielectric layers (20 and 30) would have to be electrically isolated from the connection node (66).

In FIG. 1 the electrical components (72 and 74), which are mounted within the solid volume, might perform some other function, either related to or possibly unrelated to the enclosed inductor (the shorted transmission line inductor). In either case, locating components within the volume occupied by the inductor structure (10) reduces curcuit board space that would be required to mount the devices outside the volume, on a circuit board.

In the preferred embodiment the upper and lower substrates (30 and 20) are glass but might also be ceramic or other material that has an appropriate dielectric constant. Appropriate dielectric constants and dielectric losses might change with the frequency of operation or other factors. In the preferred embodiment, materials with dielectric constants less than 8 and a dielectric loss constant less than 0.005 are considered acceptable.

Figure 2:
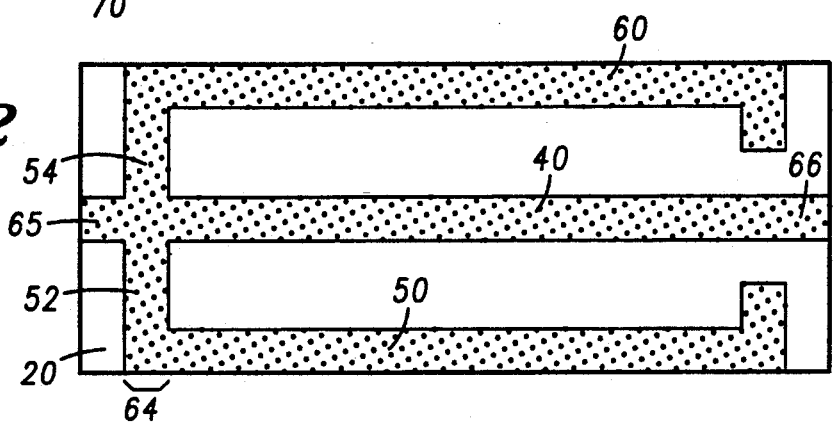
FIG. 2 shows a top view of the conductive paths on a dielectric layer of the inductor structure shown in FIG. 1.

FIG. 2 shows a top view of the layout of the shorted transmission line comprised of the conductive strips (40, 50 and 60) deposited onto the lower dilelctric layer (20). The center conductor (40) of this shorted transmission line has one end (66) exposed when the upper dielectric layer (30) is placed over the lower layer (20) for external connections to the inductor. The opposite end (65) of the transmission line inductor is also exposed when the upper dielectric layer (30) is placed over thae lower dielectric layer (20) to permit connection of the shorted end (64) of the transmission line inductor to the conductive outer layer of hte solid volume.

Figure 3:
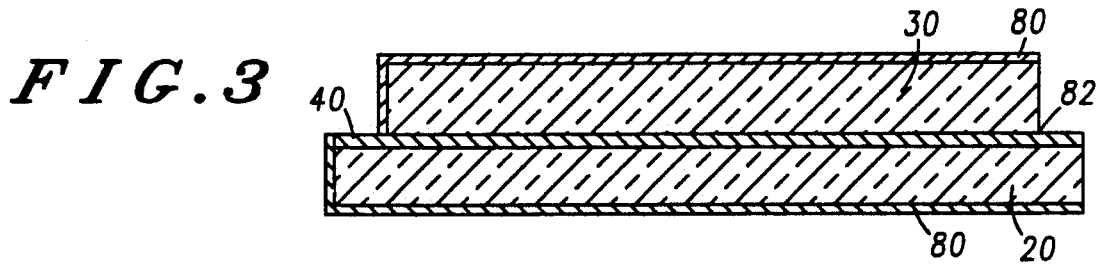
FIG. 3 shows a side view of the structure shown in FIG. 1.

FIG. 3 shows a side view of the inductor structure shown in FIG. 1 but without showing the placement of internmal electrical components. In FIG. 3 it can be seen that the shorted transmission line comprised of the conductive strips (40, 50 and 60) is the middle layer between the lower and upper dielectric layers (20 and 30).

The outer conductive layer (shown as item 80 in FIG. 3) is more readily seen in FIG. 3 and in this figure it is shown in contact with the shorted end (64) of the transmission line (40, 50 and 60) via the external connection node (65) at the shorted end (64). The outer conductive layer (80) ,which might be comprised of a copper layer, an aluminum layer, a silver layer, or a gold layer, does not contact the connection node (66) of the center conductor (40) in the region denoted as item 82 in FIG. 3 providing thereby an electrically isolated input port to the inductor.

In the preferred embodiment the thickness of he conductive strips was approximately 0.006" although alternate embodiments might contemplate material thicknesses greater or less than this amount. The material used for the conductive strip would include aluminum, copper, silver, or gold. In placing electrical components between the upper and lower dielectric layers (30 and 20) respectively, the thickness of the conductive strips might dicate what types of components can be placed within the inductor structure (10) although recesses in the upper and lower dielectric layers (20 and 30) might accommodate larger electrical components within the structure (10).

FIG. 4 shows a top view of an inductor structure (10) including internally located components. In this figure, some electrical components (74, 76, 78, and 79) between the center conductor (40) of the shorted transmission line and one leg (50) of the outer conductors (50 and 60). The placement of the components in FIG. 4 to one side of the center conductor (40) is arbitrary. Alternate embodiments would include components being placed within the solid volume that are above, below, and to both side of the center conductor (40).

Figure 5:
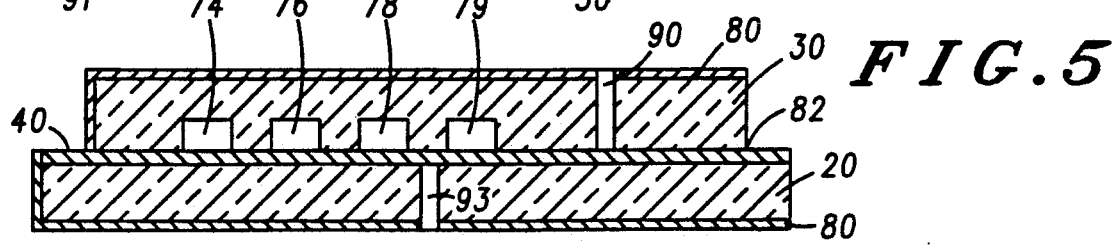

FIG. 5 shows a side view of the relative placement of these components (74, 76, 78 and 79). In the side view, these components are shown placed within the solid volume defined by the upper and lower dielectric lalyers (20 and 30). Electrical connections between these components is shown in FIG. 4 as accomplished by means of conductive strips (91, 92, 94, 96, and 98) wdhich both couple electrical signals between the components and between the interior and the exterior of the inductor structure. Alternate embodiments might include the use of via holes, (90 and 93) as shown in FIG. 5. Thesee via holes would typically include holes through the dielectric layers (20 and 30) that might be abraided, drilled, tooled, molded, or etched through the dielectric layers, then plated or filled with conductive material as required. The via holes (90 and 93) might be placed substantially anywhere on the solid volume so long as they are capable of penetrating the dielectric layers (20 and 30) to appropriate points between the component devices (74, 76, 78 and 79) and are electrically isolated from the outer conductor (80). (As shown in FIG. 1, via holes (93) might also be added to the lower dielectric layer (20), or upper layer (30), by which signals might be coupled to the cneter conductor (40) or the tab (66). Such via holes might be useful for so-called surface mount applications. A cut-back (67) in the outer metallization surrounding the via hole would of course be required to isolate the conductive path of the via hole from the outer conductive layer.)

It should be understood that in the case of these electrical components (74, 76, 78 and 79) that are mounted within this solid volume of the inductor structure (10) that cavities to accept these components might be required in either the upper dielectric layer (30), the lower dielectric layer (20), or both the upper and lower layers (30 and 20) respectively.

The components mounted within the inductive structure (10) could be passive components such as capacitors and resistors but might also be active components such as transistors (74) as shown in FIG. 1 or an integrated circuit (72);, also as shown in FIG. 1. In FIG. 1 a two leaded passive device (70) is shown coupling the center conductor (40) of the transmission line to a portion of the outer conductor (60).

By appropriately patterning a dielectric layer such as a planar glass substrate with conductive material, layering a second glass substrate on to it and internally mounting components within the volume defined by the upper and lower layers, substantial space savings can be realized as well as improved electrical shielding of signals carried by devices within the solid volume.

What is claimed is:

1. An inductor, occupying a volume, having electronic components mounted within the volume occupied by the inductor structure, said inductor structure comprised of:
   a first dielectric substrate layer having at least first and second sides and having an electrically conductive material strip on said first side having a predetermined length and first and second ends;
   a second dielectric substrate layer, having first and second sides coupled to said first side of said first dielectric substrate layer substantially covering the electrically conductive material strip, the first and second coupled dielectric substrate layers forming a substantially solid volume;
   a conductive outer layer, coupled to and substantially surrounding the substantially solid volume, and being electrically coupled to the first end of the conductive strip;
   at least one electrical component enclosed within said solid volume;
   means for coupling electrical signals between the exterior of the solid volume and the at least one electrical component;
such that an inductance exists at said second end of conductive strip, said first end of said strip being shorted to said conductive outer layer.

2. The inductor structure of claim 1 including via hole means through the substantially solid volume for coupling electrical signals to the at least one electrical component from the exterior of the solid volume.

3. The inductor structure of claim 2 including cut back areas substantially surrounding the via hole means.

4. The inductor structure of claim 1 including via hole means through the dielectric layers for coupling electrical signals to at least the electrically conductive material strip on said first side of said first dielectric layer.

5. The inductor structure of claim 4 including cut back areas substantially surrounding the via hole means through the dielectric layers.

6. The inductor structure of claim 1 including means for coupling electrical signals between said conductive strip, said outer conductive layer and said at least one electrical component.

7. The inductor structure of claim 1 where said dielectric layers are glass.

8. The inductor structure of claim 1 where said dielectric layers have a dielectric constant less than 8 and a dielectric loss less than 0.005.

9. The inductor structure of claim 1 where said dielectric layers are ceramic.

10. The inductor structure of claim 1 where said dielectric layers are polymeric.

11. The inductor structure of claim 1 where said electrically conductive material includes an aluminum layer.

12. The inductor structure of claim 1 where said electrically conductive material includes a copper layer.

13. The inductor structure of claim 1 where said electrically conductive material includes a silver layer.

14. The inductor structure of claim 1 where said electrically conductive material includes a gold layer.

15. The inductor structure of claim 1 where said conductive outer layer includes a copper layer.

16. The inductor structure of claim 1 where said conductive outer layer includes an aluminum layer.

17. The inductor structure of claim 1 where said conductive outer layer includes a silver layer.

18. The inductor structure of claim 1 where said conductive outer layer includes a gold layer.

19. The inductor structure of claim 1 where said at least one electrical component is an integrated circuit.

20. The inductor structure of claim 1 where said at least one electrical component is a passive electrical component.

21. The inductor structure of claim 1 where said means for coupling signals between the exterior of said volume and said at least one electrical component is comprised of signal paths comprised of electrically conductive material on said first side of said first dielectric layer.

22. The inductor structure of claim 1 where said second dielectric layer includes at least one cavity adapted to substantially enclose said at least one electrical component enclosed within said volume.

23. An inductor, occupying a volume, having electronic components mounted within the volume occupied by the inductor structure, said inductor structure comprised of:
   a first dielectric substrate layer having at least first and second sides and having an electrically conductive material strip on said first side having a predetermined length and first and second ends;
   a second dielectric substrate layer, having first and second sides coupled to said first side of said first dielectric substrate layer substantially covering the electrically conductive material strip, the first and second coupled dielectric substrate layers forming a substantially solid volume having an exterior surface;
   at least one cavity, within said solid volume, adapted to enclose an electrical component within said solid volume;
   a conductive outer layer, coupled to the exterior surface of the solid volume and substantially surrounding the substantially solid volume, and being electrically coupled to the first end of the conductive strip;
   at least one electrical component enclosed within said solid volume;
   means for coupling electrical signals between the exterior of the said volume and the at least one electrical component;
such that an inductance exists at said second end of conductive strip, said first end of said strip being shorted to said conductive outer layer.

24. The inductor structure of claim 23 including via hole means through the substantially solid volume for coupling electrical signals to the at least one electrical component from the exterior of the solid volume.

25. The inductor structure of claim 24 including cut back areas substantially surrounding the via hole means.

26. The inductor structure of claim 23 including via hole means through the dielectric layers for coupling electrical signals to at least the electrically conductive material strip on said first side of said first dielectric layer.

27. The inductor structure of claim 26 including cut back areas substantially surrounding the via hole means through the dielectric layers.

28. The inductor structure of claim 23 including means for coupling electrical signals between said conductive strip, said outer conductive layer and said at least one electrical component.

29. The inductor structure of claim 23 where said dielectric layers are glass.

30. The inductor structure of claim 23 where said dielectric layers have a dielectric constant less than 8 and a dielectric loss less than 0.005.

31. The inductor structure of claim 23 where said dielectric layers are ceramic.

32. The inductor structure of claim 23 where said dielectric layers are polymeric.

33. The inductor structure of claim 23 where said electrically conductive material includes an aluminum layer.

34. The inductor structure of claim 23 where said electrically conductive material includes a silver layer.

35. The inductor structure of claim 23 where said electrically conductive material includes a gold layer.

36. The inductor structure of claim 23 where said electrically conductive material a copper layer.

37. The inductor structure of claim 23 where said conductive outer layer includes a copper layer.

38. The inductor structure of claim 23 where said conductive outer layer includes an aluminum layer.

39. The inductor structure of claim 23 where said conductive outer layer includes a silver layer.

40. The inductor structure of claim 23 where said conductive outer layer includes a gold layer.

41. The inductor structure of claim 23 where said at least one electrical component is an integrated circuit.

42. The inductor structure of claim 23 where said at least one electrical component is a passive electrical component.

43. The inductor structure of claim 23 where said means for coupling signals between the exterior of said volume and said at least one electrical component is comprised of signal paths comprised of electrically conductive material on said first side of said first dielectric layer.

44. An inductor, occupying a volume, having electronic components mounted within the volume occupied by the inductor structure, said inductor structure comprised of:

a first substantially planar glass dielectric substrate layer having at least first and second sides and having an electrically conductive material strip on said first side having a predetermined length and first and second ends;

a second substantially planar glass dielectric substrate layer, having first and second sides coupled to the first side of the first glass dielectric substrate layer substantially covering the electrically conductive material strip, the first and second coupled glass dielectric substrate layers forming a substantially solid volume;

at least one cavity, within said solid volume, adapted to enclose an electrical component within said solid volume;

a conductive outer layer, coupled to and substantially surrounding the substantially solid volume, and being electrically coupled to the first end of the conductive strip;

at least one electrical component enclosed within said solid volume;

means for coupling electrical signals between the exterior of the solid volume and the at least one electrical component;

such that an inductance exists at said second end of conductive strip, said first end of said strip being shorted to said conductive outer layer.

45. The inductor structure of claim 44 including via hole means through the substantially solid volume for coupling electrical signals to the at least one electrical component from the exterior of the solid volume.

46. The inductor structure of claim 45 including cut back areas substantially surrounding the via hole means.

47. The inductor structure of claim 44 including via hole means through the dielectric layers for coupling electrical signals to at least the electrically conductive material strip on said first side of said first dielectric layer.

48. The inductor structure of claim 47 including cut back areas substantially surrounding the via hole means through the dielectric layers.

49. The inductor structure of claim 44 including means for coupling electrical signals between said conductive strip, said outer conductive layer and said at least one electrical component.

50. The inductor structure of claim 44 where said electrically conductive material includes an aluminum layer.

51. The inductor structure of claim 44 where said electrically conductive material includes a copper layer.

52. The inductor structure of claim 44 where said electrically conductive material includes a silver layer.

53. The inductor structure of claim 44 where said electrically conductive material includes a gold layer.

54. The inductor structure of claim 44 where said conductive outer layer includes a copper layer.

55. The inductor structure of claim 44 where said conductive outer layer includes an aluminum layer.

56. The inductor structure of claim 44 where said conductive outer layer includes a silver layer.

57. The inductor structure of claim 44 where said conductive outer layer includes a gold layer.

58. The inductor structure of claim 44 where said at least one electrical component is an integrated circuit.

59. The inductor structure of claim 44 where said at least one electrical component is a passive electrical component.

* * * * *

UNITED STATES PATENT AND TRADEMARK OFFICE
CERTIFICATE OF CORRECTION

PATENT NO. : 5,083,236

DATED : January 21, 1992

INVENTOR(S) : Marc K. Chason et al.

It is certified that error appears in the above-identified patent and that said Letters Patent is hereby corrected as shown below:

Col. 6, line 55, the word "said" should be --solid--.

Col. 7, line 27, between the words "material" and "a" please insert the word --includes--.

Signed and Sealed this

Twenty-seventh Day of April, 1993

Attest:

MICHAEL K. KIRK

*Attesting Officer*      Acting Commissioner of Patents and Trademarks